United States Patent
Gatti

(10) Patent No.: US 7,400,195 B2
(45) Date of Patent: Jul. 15, 2008

(54) VARIABLE-GAIN DIFFERENTIAL AMPLIFIER

(75) Inventor: Paolo Gatti, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 119 days.

(21) Appl. No.: 11/404,585

(22) Filed: Apr. 14, 2006

(65) Prior Publication Data

US 2006/0232336 A1 Oct. 19, 2006

(30) Foreign Application Priority Data

Apr. 15, 2005 (FR) .................................. 05 03820

(51) Int. Cl.
*H03F 3/45* (2006.01)

(52) U.S. Cl. ...................................... 330/259; 330/254

(58) Field of Classification Search ................. 330/259, 330/69, 254, 295
See application file for complete search history.

(56) References Cited

U.S. PATENT DOCUMENTS 6,359,510 B1 3/2002 Ishii et al.
7,202,741 B2 * 4/2007 Park et al. .................... 330/254
2003/0140320 A1 7/2003 Sobel
2003/0169104 A1 9/2003 Huckins et al.
2004/0066232 A1 4/2004 Mouret et al.

OTHER PUBLICATIONS

FR Search Report No. FR 0503820; Dec. 12, 2005.

* cited by examiner

*Primary Examiner*—Robert J. Pascal
*Assistant Examiner*—Hieu P Nguyen
(74) *Attorney, Agent, or Firm*—Hogan & Hartson LLP

(57) ABSTRACT

A variable-gain amplifier with high input impedance includes positive and negative inputs, positive and negative outputs, first and second differential circuits and first, second and third impedances. The impedances form an impedance bridge between the outputs. The first and second differential circuits each have one input coupled to one of the inputs of the differential amplifier, one input coupled to the impedance bridge, and two outputs connected to the outputs of the differential amplifier. At least one of the impedances is a variable impedance.

17 Claims, 3 Drawing Sheets

FIG.4.
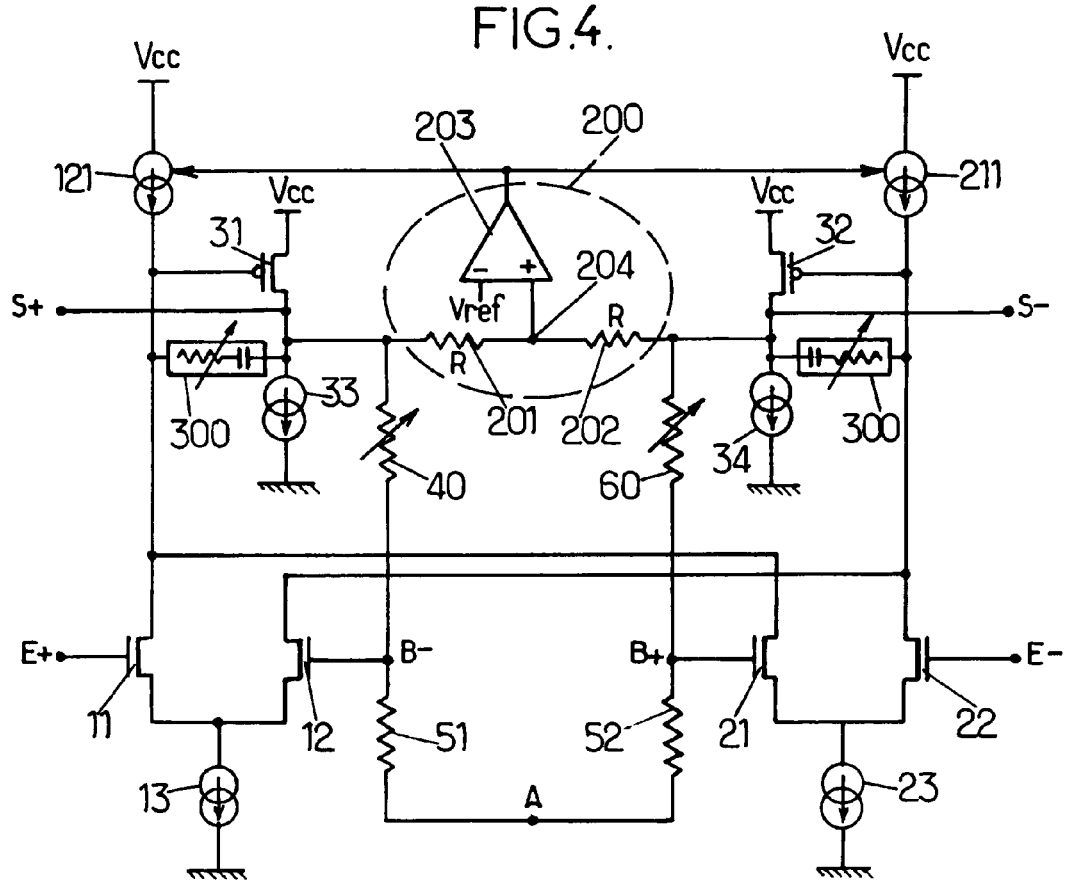
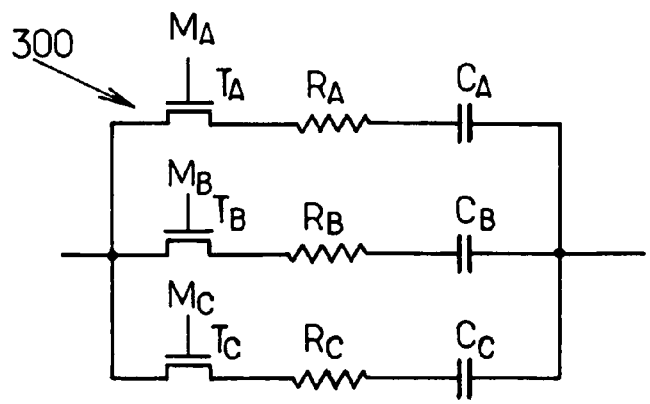
FIG.5.

VARIABLE-GAIN DIFFERENTIAL AMPLIFIER

RELATED APPLICATION

This application claims priority of French Patent Application No. 05 03820, filed Apr. 15, 2005, which is incorporated herein in its entirety by this reference.

1. Field of the Invention

The invention relates to integrated circuit amplifiers and, more particularly, to differential amplifiers having a gain control input for adjusting the amplification ratio.

2. Background of the Invention

Variable-gain amplifiers are notably used in Automatic Gain Control (AGC) amplification circuits, in particular in audio applications.

Among the many known types of variable-gain amplifiers, differential amplifiers use pairs of signals called differential signals. Differential signals allow the signal-to-noise ratio to be improved and are capable of working at higher frequencies. Such amplifiers are, for example, used in data transmission systems.

Essentially, two techniques are used in the design of variable-gain amplifiers. A first technique includes varying a negative feedback element of an amplifier. A second technique, such as, for example, that described in WO 02/49210 (PCT/FR01/04007; see also US 2004/0066232 A1) includes adding a variable attenuation stage at the input of the amplifier. Whatever the technique used, one drawback of the known circuits is that they exhibit a low input impedance (in the order of 10 kΩ).

SUMMARY OF THE INVENTION

The invention proposes a variable-gain amplifier having a high input impedance (in the order of 1 MΩ). Advantageously, the amplifier proposed can be fabricated in a relatively simple manner by known integrated circuit fabrication techniques.

For this purpose, a first aspect of the invention proposes a differential amplifier having a first input, a second input, a first output and a second output. The amplifier comprises a first and a second differential circuit. The first differential circuit has a first input coupled to the first input of the differential amplifier, a second input, and also a first output and a second output respectively coupled to the first output and to the second output of the differential amplifier, possibly via an amplification circuit such as a third differential circuit. The second differential circuit has a first input coupled to the second input of the differential amplifier, a second input, and also a first output and a second output respectively coupled to the second output and to the first output of the differential amplifier. The differential amplifier also comprises a first impedance connecting the first output of the differential amplifier to the second input of the first differential circuit, a second impedance connecting the second output of the differential amplifier to the second input of the second differential circuit, and a third impedance connecting the second input of the second differential circuit to the second input of the first differential circuit. At least one of the first, second and third impedances is a variable impedance. In addition, the first and second inputs of each of the first and second differential circuits correspond to the respective gates of a differential pair of transistors (e.g., MOSFET transistors) of these circuits.

Thus connected, the three impedances form a divider bridge disposed between the outputs of the differential amplifier, whose outputs (i.e., the nodes common to two impedances) are fed back into the inputs of the first and second differential circuits so as to provide a variable negative feedback. A high input impedance is obtained thanks to the fact that the inputs of the differential circuits correspond to gates of MOS transistors which are essentially capacitive. More generally speaking, a high input impedance can be achieved with any active components in place of the MOS transistors, notably with other types of transistors, for example MESFETs, GaAs transistors or bipolar transistors (BJT), either in a conventional configuration, preceded by follower stages, or using a Darlington configuration, etc.

In one embodiment, the differential amplifier additionally comprises at least one amplification circuit having a first input coupled to the first output of the first differential circuit and to the second output of the second differential circuit, a second input coupled to the second output of the first differential circuit and to the first output of the second differential circuit, a first output coupled to the first output of the differential amplifier, and a second output coupled to the second output of the differential amplifier. This circuit provides a high open-loop gain and hence allows the bandwidth to be increased. It also allows the gain of the feedback-controlled amplifier to be made more independent of the gain of the first and second differential circuits.

In one embodiment, the first and second impedances, that provide the negative feedback, are two variable impedances, and the third impedance is a fixed impedance. In actual fact, only one of the first and second impedances need be variable, but the fact that they are both variable provides a symmetry in the design and the operation of the amplifier. This symmetry is advantageous in the case of a differentially controlled system.

Preferably, the impedances are elements that are essentially resistive which are simpler to produce.

In particular, a variable impedance can comprise a switched array of elements that are essentially resistive, the value of the variable impedance being controlled as a function of switching signals defining a configuration of the switched array comprising a set of resistive elements in parallel and/or in series.

In one embodiment, the differential amplifier additionally comprises two stabilization circuits in parallel with the amplification circuit connecting, for one, the first output of the first differential circuit and the second output of the second differential circuit to the second output of the differential amplifier and, for the other, the second output of the first differential circuit and the first output of the second differential circuit to the first output of the differential amplifier. These circuits allow for improved stability of the feedback-controlled amplifier.

For example, each stabilization circuit can comprise a plurality of impedance branches connected in parallel with one another and each comprising a switching circuit for opening or closing at least one of the branches as a function of control signals respectively applied to the inputs of the switching circuits.

When the differential circuits comprise current sources for biasing their outputs, the differential amplifier can also comprise a compensation circuit connected to the outputs of the differential amplifier for controlling the current sources, to compensate for any possible variations in the common-mode voltage.

For example, such a circuit can comprise a resistor bridge connecting the outputs of the differential amplifier, this bridge having an output node delivering a voltage substantially equal to the mean of the voltages present at the outputs, together with an error amplifier which amplifies the voltage difference between the mean of the voltages and a reference voltage, and delivers an amplified error signal to the current sources as control signal.

Other aspects of the invention relate to an audio CD (Compact Disc) and/or DVD (Digital Versatile Disc) player and/or recorder, to an audio and/or video decoder unit of the "Set Top Box" type for the reception of satellite-relayed signals, an encoder and/or decoder of the DVB-T (Digital Video Broadcasting-Terrestrial) or DVB type for digital television signals, terrestrial or otherwise, or of the DMB (Digital Multimedia Broadcasting) type for digital multimedia signals (encoding sound, images and data), and to an audio and/or video tuner (for example a TV tuner), comprising a differential amplifier according to the first aspect.

BRIEF DESCRIPTION OF THE DRAWINGS

The invention will be better understood and other features and advantages will become apparent upon reading the description that follows and which makes reference to the appended drawings in which:

FIG. 4 is a circuit diagram of the amplifier in FIG. 2 also including additional compensation devices; and FIG. 5 shows a preferred exemplary embodiment of such a compensation circuit.

DETAILED DESCRIPTION

Figure 1:
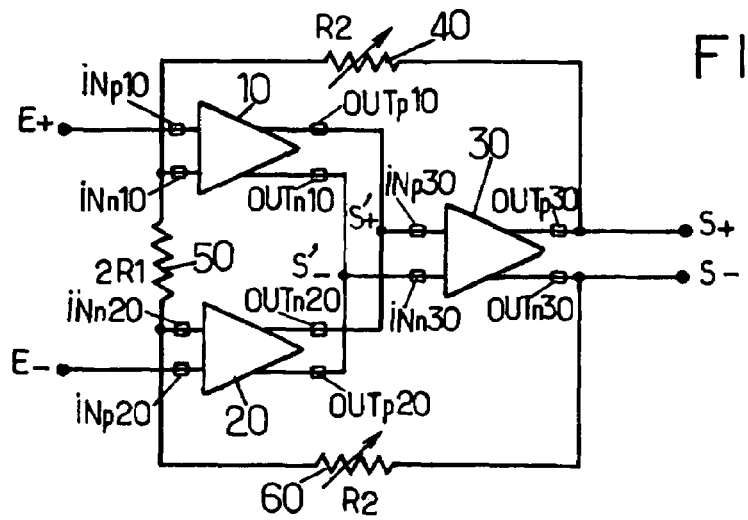
FIG. 1 is a functional circuit diagram of an amplifier according to the invention.

FIG. 1 is a functional circuit diagram of an exemplary embodiment of a differential amplifier according to the present invention. The amplifier comprises differential amplification circuits 10, 20 and 30, coupled together, in part, via impedances 40, 50 and 60 forming a negative feedback loop for controlling the gain.

The differential amplification circuits 10 and 20 are preferably identical to one another. Each differential circuit 10 or 20 comprises a positive input INp10 and INp20, respectively, a negative input INn10 and INn20, respectively, a positive output OUTp10 and OUTp20, respectively, and a negative output OUTn10 and OUTn20, respectively. These differential circuits each comprise a differential pair of transistors biased by current sources. The transistors are for example MOSFET transistors. Such differential circuits are high-gain circuits with a high input impedance. The positive input of the differential circuit 10 is connected to a positive input terminal E+ of the differential amplifier, and the negative input of the differential circuit 20 is connected to a negative input terminal E− of the amplifier. In place of MOSFET transistors, JFET, MESFET, BJT, or GaAs transistors, etc., or any other type of active component, can be used.

The differential amplification circuit 30 is a high-gain amplifier comprising a positive input INp30, a negative input INn30, a positive output OUTp30 and a negative output OUTp30. The positive input INp30 of the circuit 30 is connected to the positive output OUTp10 of the differential circuit 10 and to the negative output OUTn20 of the second differential circuit 20. The negative input INn30 of the circuit 30 is connected to the negative output OUTn10 of the first differential circuit 10 and to the positive output OUTp20 of the second differential circuit 20. The positive output OUTp30 of the circuit 30 is connected to a positive output terminal S+ of the amplifier, and the negative output OUTn30 of the circuit 30 is connected to a negative output terminal S− of the amplifier.

The operation of the circuit is the following. Supposing that the potential at the output S+ rises owing to interference, this will make the potential at the input INn10 of the circuit 10 rise. Hence, its differential input voltage (between its inputs INp10 and INn10) falls. The potential at the output OUTp10 of the circuit 10 also falls. It then follows that the differential input voltage of the circuit 30 (between its inputs INp30 and INn30) falls, and consequently so does the potential at the output S+. This reasoning shows that the feedback is negative. The same reasoning can be applied to the circuit 20.

The circuit 30 is not indispensable to the invention and may therefore be omitted. This circuit 30 could indeed be replaced by simple conducting wires connecting the outputs OUTp10 and OUTn20 of the differential circuits 10 and 20, respectively, directly to the positive output terminal S+, and the outputs OUTn10 and OUTp20 of the differential circuits 10 and 20, respectively, directly to the negative output terminal S. This is the reason why, in the figure, the node common to the outputs OUTp10 and OUTn20 of the differential circuits 10 and 20, respectively, is denoted S'+, and the node common to the outputs OUTn10 and OUTp20 of the differential circuits 10 and 20, respectively, is denoted S'−. The nodes S'+ and S'− would correspond to the outputs of the differential amplifier in the absence of the circuit 30.

It can be shown that the feedback loop always provides a negative feedback.

However, it is preferable to provide the amplification circuit 30 in order to increase the open-loop gain of the amplifier and thus render the gain of the amplifier independent of the gain of the differential circuits 10 and 20 when its feedback loop is via the impedances 40, 50 and 60.

The impedances 40, 50 and 60 provide the feedback loop circuit of the differential amplifier. These are, for example, impedances that are essentially resistive. The impedance 40, of value R2, connects the positive output terminal S+ to the negative input of the differential circuit 10. The impedance 50, of value 2×R1, connects the negative input of the differential circuit 10 to the negative input of the differential circuit 20. The impedance 60, of value R2, connects the negative input of the differential circuit 20 to the negative output terminal S−.

The gain of the amplifier in FIG. 1 is easily calculated, when the open-loop gain is very high, and is expressed by the following formula:

$$G = \frac{V_{(S+)} - V_{(S-)}}{V_{(E+)} - V_{(E-)}} = 1 + \frac{R2}{R1}.$$

In order to make the gain variable and controllable, it is sufficient for at least one of the impedances to be variable. Preferably, the impedance 50 is fixed and the impedances 40 and 60 are variable impedances, for reasons of symmetry making the implementation more straightforward. However, it is also possible to use an impedance 50 that is variable in combination with impedances 40 and 60 of fixed or variable value.

Figure 2:
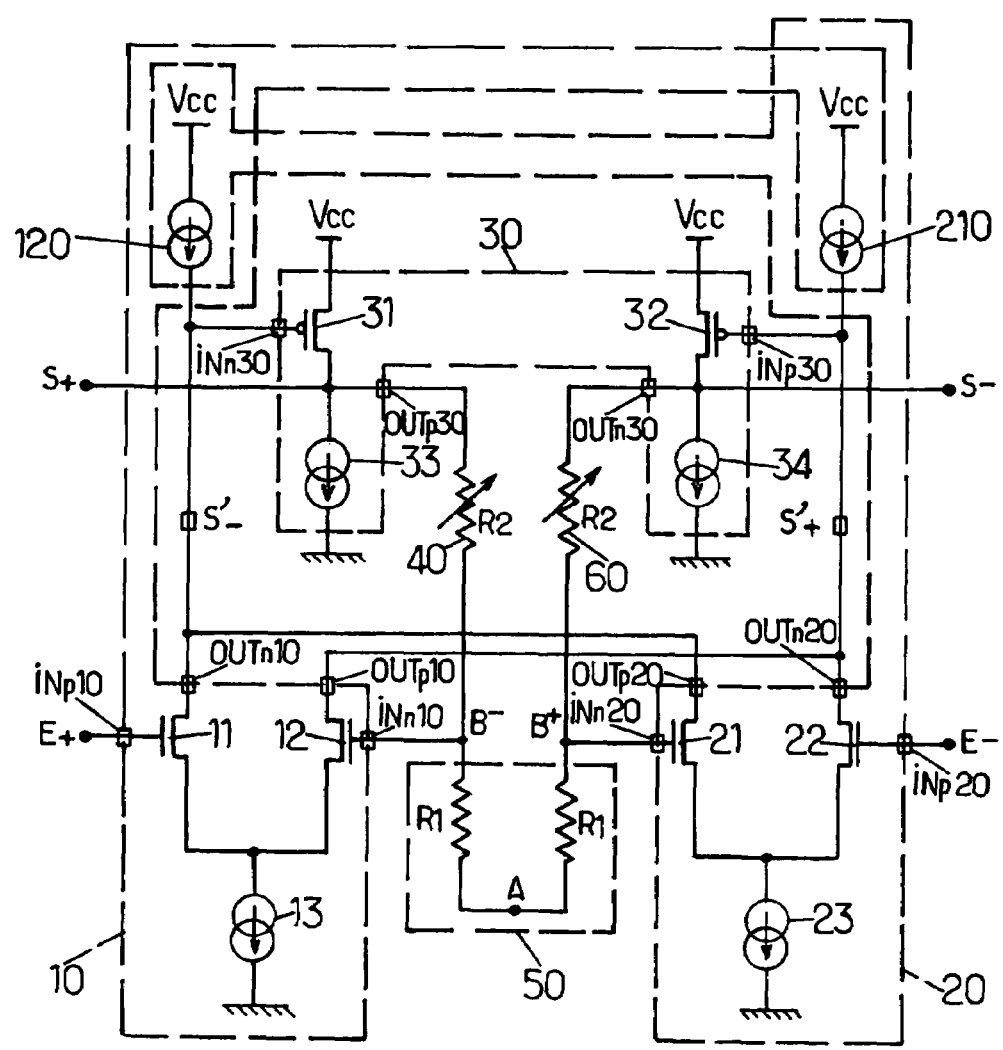
FIG. 2 shows a detailed embodiment of the circuit in FIG. 1.

A detailed representation of an integrated circuit form of the embodiment of the amplifier in FIG. 1 is shown in FIG. 2.

The differential amplification circuit 10 comprises a pair of nMOS transistors 11 and 12 forming a differential pair biased by a common current source 13 and two independent current sources 120 and 210. The differential amplification circuit 20 comprises a pair of nMOS transistors 21 and 22 forming a differential pair biased by a common current source 23 and the two independent current sources 120 and 210. The independent current sources 120 and 210 are thus common to the differential circuits 10 and 20 in order to provide the coupling of the outputs, positive and negative respectively, of the differential circuits 10 and 20.

For optimum operation, the components should be provided in matched pairs: the current sources 120 and 210 are preferably identical to one another, the transistors 11, 12, 21 and 22 have the same dimensions and are placed close to each other, the common sources 13 and 23 are identical to one another and the independent sources 120 and 210 deliver a current that is substantially identical to the current delivered by the common sources 13 and 23.

The negative output of the differential circuit 10 and the positive output of the differential circuit 20 correspond to the node between the independent current source 120 and the drains of the transistors 11 and 21. Similarly, the positive output of the differential circuit 10 and the negative output of the differential circuit 20 correspond to the node between the independent current source 210 and the drains of the transistors 12 and 22.

The positive and negative inputs of the differential circuits 10 and 20 correspond to the gates of the nMOS transistors which present a high input impedance. The terminals of the amplifier corresponding to these inputs also present a high input impedance.

Here, the amplification circuit 30 is designed in the form of two independent signal amplifiers each formed by a pMOS transistor 31 or 32 whose channel is in series with a current source 33 or 34 between two power supply conductors. The inputs of the amplification circuit 30 correspond to the gates of the pMOS transistors 31 and 32, and the outputs of the amplification circuit 30 correspond to the nodes between the drains of the pMOS transistors 31 and 32 and the current sources 33 and 34.

Here, the impedance 50 is a fixed impedance separated into two resistors 51 and 52 of the same value R1 connected in series. The node A between the two resistors 51 and 52 is a node at a fixed potential corresponding to the common-mode potential. The impedances 40 and 60 are variable impedances.

In one variant, the resistors 51 and 52 are variable and the impedances 40 and 60 are fixed.

Figure 3:
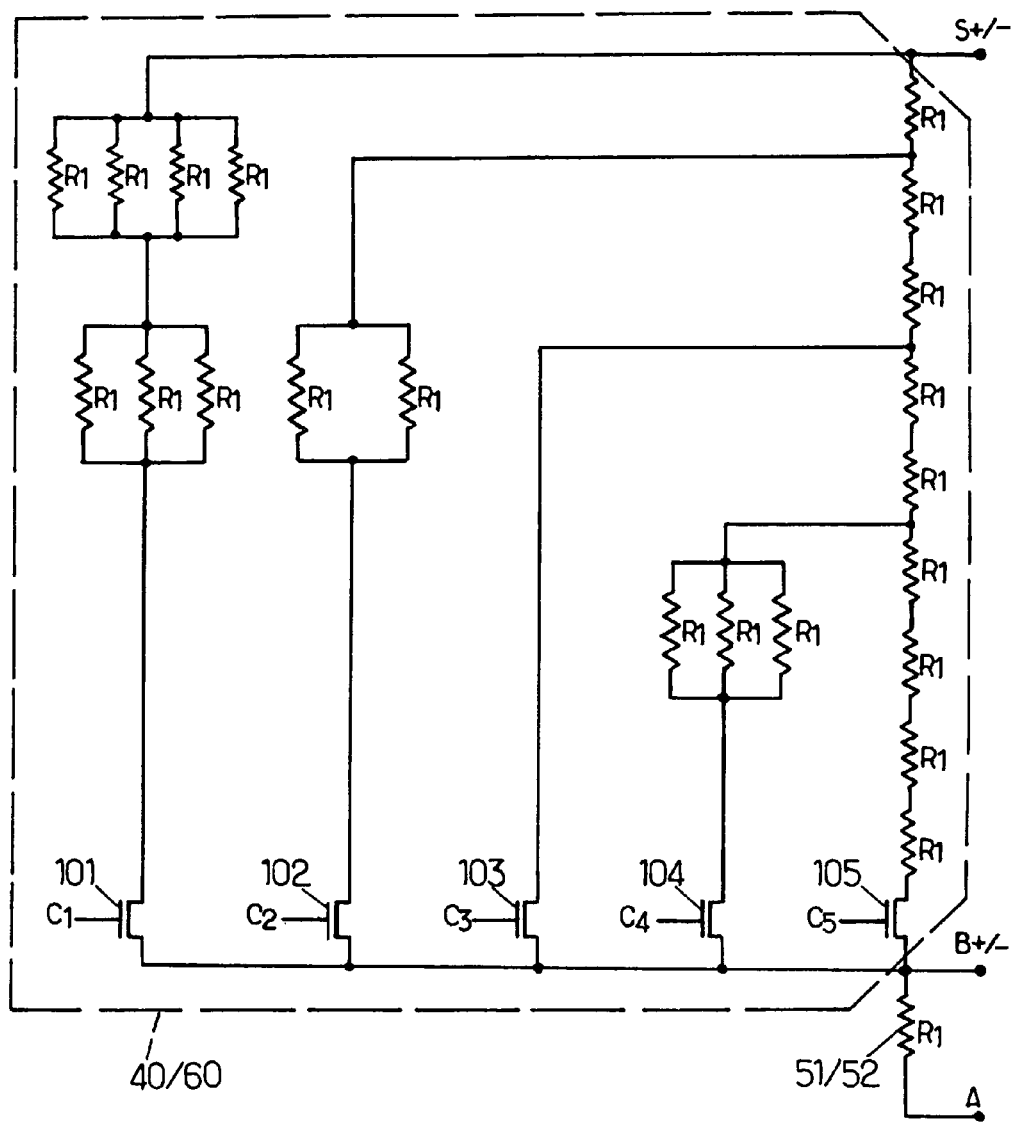
FIG. 3 shows an exemplary embodiment of a variable resistance.

FIG. 3 illustrates one embodiment of the variable impedances 40 or 60 in relation to the fixed impedance, 51 or 52 respectively. In order to achieve precision in the ratio R2/R1, it is desirable to use resistive elements of the same value in a space where the gradient of the variation in value of the component can be considered as unchanged. For chosen gain values, for example 20 dB, 16 dB, 12 dB, 8 dB and 4 dB, it is more practical to vary the impedance corresponding to the resistance R2 by combining in series and in parallel resistors of value corresponding to R1. Accordingly, the example shown in FIG. 3 comprises five branches in parallel respectively comprising:

an array of four resistors R1 in parallel, in series with an array of three resistors R1 in parallel;
a resistor R1 in series with an array of two resistors R1 in parallel;
three resistors R1 in series;
five resistors R1 in series, in series with an array of three resistors R1 in parallel; and
nine resistors R1 in parallel.

For other choices of gain values, it may be preferable to vary the impedance corresponding to 51 or 52, respectively.

There exist various possibilities for varying a value of resistance by means of switches. One embodiment includes selecting a branch of resistors from among a number of branches corresponding to the number of possible gain values (here five). Each branch is connected to the node B+ or B− via a transistor 101 to 105 receiving a control signal $C_i$ corresponding to a chosen gain, i being in the range 1 to 5 in the example considered here. Only one of the control signals $C_i$ is active at any given time in order to only select a single branch.

In order to limit the surface area occupied by the variable impedance on the silicon, resistors are common to several branches.

Table 1 below shows the precision in the gain that can be obtained with such a solution, not including dispersion linked to the value of the components:

TABLE 1

| Active branch control | Desired gain (in dB) | Value of R2 | Calculated gain (in dB) | % error between desired gain and calculated gain |
|---|---|---|---|---|
| $C_1$ | 4 | (¼ + ⅓) R1 | 3.99 | −0.25 |
| $C_2$ | 8 | (1 + ½) R1 | 7.96 | −0.5 |
| $C_3$ | 12 | 3 R1 | 12.04 | +0.33 |
| $C_4$ | 16 | (5 + ⅓) R1 | 16.02 | +0.12 |
| $C_5$ | 20 | 9 R1 | 20 | 0 |

As would be understood by those skilled in the art, the gate-source voltage of the transistors 101 to 105 corresponds to the potential difference between the control signal and the node B+ or B−. The voltage of the node B+ or B− corresponds to the common-mode voltage to which a variable component is added that corresponds to the signals of the input terminals E+ or E− to be amplified. When a control signal is inactive, at a voltage level close to a low power supply voltage, the corresponding transistor 101 to 105 is turned off. When a control signal is active, at a level close to a high power supply voltage, the corresponding transistor 101 to 105 is conducting but with a gate-source voltage modulated by the input signal. The modulation of the gate-source signal leads to a modulation of the conductivity of the transistor channel which has the effect of modulating the value of the resistance R2 as a function of the input signal.

The modulation of the resistance R2 does not present a problem for at least two reasons. A first reason is that this modulation remains very weak. Indeed, this modulation amounts to modulating the channel resistance of the MOS transistor 101 to 105 and this channel resistance is chosen to be negligible with respect to R1. The resulting modulation is therefore also negligible. A second reason is that the amplifier comprises two modulated resistances R2 and that these two resistances R2 are modulated in phase opposition. These phase opposition modulations compensate for one another if the voltages are considered differentially, and they are equivalent to a modulation of the common-mode voltage on the output terminals S+ and S−. Actually, the precision on the common-mode voltage may, or may not, be important, depending on the application.

If the sizing of the transistors 101 to 105 and strict constraints on the common-mode voltage at the output are such that it is necessary to compensate for this drawback, a common-mode detection and feedback control circuit 200 can be added as shown in FIG. 4.

The circuit in FIG. 4 corresponds to the circuit in FIG. 2 in which the independent current sources 120 and 210 are replaced by adjustable current sources 121 and 211. The circuit 200 measures the common-mode voltage at the output terminals S+ and S−. and adjusts the current of the adjustable current sources 121 and 211 in order to ensure the invariance of the common-mode voltage of the differential amplifier outputs.

By way of example, the circuit 200 comprises two resistors 201 and 202 and an error amplifier 203. The resistors 201 and 202 have the same value R and are placed in series between the output terminals S+ and S−. The node 204 between the two resistors 201 and 202 is then at the common-mode potential of the output terminals. The error amplifier 203 is connected to the node 204 and to a circuit that supplies a reference voltage Vref equal to the common-mode voltage desired at the output. The error amplifier 203 amplifies the potential difference between the node 204 and the voltage Vref in order to deliver a control signal to the adjustable current sources 121 and 211.

In amplifiers using negative feedback loops, there is a risk of instabilities appearing. These can be corrected with a stabilization circuit providing a compensation based on the Miller effect. Stabilization circuits 300 can be placed between the inputs and the outputs of the amplification circuit 30. However, one drawback with these stabilization circuits is that they reduce the bandwidth of the amplifiers. Indeed, the use of a conventional stabilization circuit in the variable-gain amplifier has the effect of shifting the cut-off frequency of the amplifier depending on the gain selected. If the variation in gain is large, the variation in the bandwidth is also significant, which can present a problem.

In order to avoid having too large a variation in the bandwidth, it is proposed that stabilization circuits 300 be used, one embodiment of which is detailed in FIG. 5. One of these circuits connects the output OUTp10 of the differential amplification circuit 10 and the output OUTn20 of the differential amplification circuit 20 to the output E− of the differential amplifier. The other stabilization circuit 300 connects the second output OUTn10 of the differential amplification circuit 10 and the output OUTp20 of the differential amplification circuit 20 to the output E+ of the differential amplifier.

The compensation circuit 300 comprises several branches in parallel. Each branch comprises a resistor $R_A$, $R_B$ or $R_C$, respectively, in series with a capacitor $C_A$, $C_B$ or $C_C$, respectively, and a transistor $T_A$, $T_B$ or $T_C$, respectively, forming a switch. In each branch, the resistor is placed between the transistor and the capacitor. Preferably, the transistor of each branch is disposed on the end of the input of the circuit 30, and the capacitor is disposed on the end of the output of the circuit 30.

The stabilization circuit does not need to comprise as many branches as the number of possible gain values since a variation in the bandwidth of the amplifier can be tolerated within certain limits. Each transistor $T_A$, $T_B$ or $T_C$ receives a control signal $M_A$, $M_B$ or $M_C$, respectively. At any given time, only one of the control signals is active, such that only one branch is effectively linked between the input and the output of the amplification circuit 30.

As an example, the stabilization circuit only comprises three branches for five possible gain values. The signal $M_A$ is active if the control signal C1 or C2 is active, the signal $M_B$ being active if the signal C3 or C4 is active, and the signal $M_C$ is active if the signal C5 is active. In the case where there are a higher number of possible gain values, for example twenty gain possibilities, the number of branches in the stabilization circuit can be increased by a lower proportion since the selection of a branch can correspond to three or four gain values.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. A differential amplifier having a first input, a second input, a first output and a second output, comprising:
    a first differential circuit having a first input coupled to the first input of the differential amplifier, a second input, and first and second outputs respectively coupled to the first and second outputs of the differential amplifier;
    a second differential circuit having a first input coupled to the second input of the differential amplifier, a second input, and first and second outputs respectively coupled to the second and first outputs of the differential amplifier;
    a first impedance coupling the first output of the differential amplifier to the second input of the first differential circuit;
    a second impedance coupling the second output of the differential amplifier to the second input of the second differential circuit;
    a third impedance coupling the second input of the second differential circuit to the second input of the first differential circuit; and
    a common-mode detection and feedback control circuit coupled to the outputs of the differential amplifier for controlling the current source;
wherein at least one of the first, second and third impedances is a variable impedance, wherein the first and second inputs of each of the first and second differential circuits correspond to the respective gates of a differential pair of transistors of the circuits, and wherein the differential circuits each comprise current sources for biasing their outputs.

2. The differential amplifier according to claim 1, further comprising at least one amplification circuit coupled between the first and second differential circuits and the outputs of the differential amplifier.

3. The differential amplifier according to claim 2, wherein the at least one amplification circuit comprises:
    a first input coupled to the first output of the first differential circuit and to the second output of the second differential circuit;
    a second input coupled to the second output of the first differential circuit and to the first output of the second differential circuit;

a first output coupled to the first output of the differential amplifier; and a second output coupled to the second output of the differential amplifier.

4. The differential amplifier according to claim 1, wherein the first and second impedances each comprise a variable impedance.

5. The differential amplifier according to claim 1, wherein the third impedance comprises a fixed impedance.

6. The differential amplifier according to claim 1, wherein each of the first, second, and third impedances comprises a resistive element.

7. The differential amplifier according to claim 1, wherein the first and second impedances each comprise a switched array of resistive elements.

8. The differential amplifier according to claim 7, wherein the switched array is controlled by a plurality of switching signals defining a configuration thereof.

9. The differential amplifier according to claim 8, wherein the configuration of the switched array comprises a set of the resistive elements in parallel and/or in series.

10. The differential amplifier according to claim 2, further comprising two stabilization circuits in parallel with the at least one amplification circuit.

11. The differential amplifier according to claim 10, wherein each stabilization circuit comprises a plurality of parallel impedance branches.

12. The differential amplifier according to claim 11, further comprising a switching circuit for opening or closing at least one of the impedance branches in response to a plurality of control signals.

13. The differential amplifier according to claim 1, wherein the common-mode detection and feedback control circuit comprises:

a resistor bridge coupling the outputs of the differential amplifier, the bridge having an output node delivering a voltage substantially equal to the mean of the voltages present at the outputs; and an error amplifier that amplifies the voltage difference between the mean of the voltages and a reference voltage, and delivers an amplified error signal to the current sources as a control signal.

14. A differential amplifier having a first input, a second input, a first output and a second output, comprising:

a first differential circuit having a first input coupled to the first input of the differential amplifier, a second input, and first and second outputs respectively coupled to the first and second outputs of the differential amplifier;

a second differential circuit having a first input coupled to the second input of the differential amplifier, a second input, and first and second outputs respectively coupled to the second and first outputs of the differential amplifier;

a first switched resistor array coupling the first output of the differential amplifier to the second input of the first differential circuit;

a second switched resistor array coupling the second output of the differential amplifier to the second input of the second differential circuit;

a fixed impedance coupling the second input of the second differential circuit to the second input of the first differential circuit; and a common-mode detection and feedback control circuit coupled to the outputs of the differential amplifier for controlling the current sources, wherein the differential circuits each comprise current sources for biasing their outputs.

15. The differential amplifier according to claim 14, further comprising at least one amplification circuit coupled between the first and second differential circuits and the outputs of the differential amplifier.

16. The differential amplifier according to claim 15, further comprising two stabilization circuits in parallel with the at least one amplification circuit.

17. The differential amplifier according to claim 16, wherein each stabilization circuit comprises a plurality of switched parallel impedance branches.

\* \* \* \* \*